(12) United States Patent
van Veldhoven et al.

(10) Patent No.: US 11,695,377 B2
(45) Date of Patent: Jul. 4, 2023

(54) AMPLIFIER WITH LOW COMPONENT COUNT AND ACCURATE GAIN

(71) Applicant: NXP B.V., Endhoven (NL)

(72) Inventors: Robert van Veldhoven, Valkenswaard (NL); John Pigott, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/501,757

(22) Filed: Oct. 14, 2021

(65) Prior Publication Data
US 2023/0118374 A1    Apr. 20, 2023

(51) Int. Cl.
H03F 3/45     (2006.01)
H03F 3/387    (2006.01)
H03F 3/193    (2006.01)

(52) U.S. Cl.
CPC ........... *H03F 3/387* (2013.01); *H03F 3/1935* (2013.01); *H03F 3/45179* (2013.01); *H03F 3/45183* (2013.01)

(58) Field of Classification Search
CPC .... H03F 3/45; H03F 3/45183; H03F 3/45179; H03F 3/45192; H03F 3/45089; H03F 1/02; H03F 3/45475; H03F 1/303; H03F 3/005
USPC ....................................................... 330/253
See application file for complete search history.

(56) References Cited

U.S. PATENT DOCUMENTS

| | | | | |
|---|---|---|---|---|
| 6,573,784 | B2* | 6/2003 | Gower | G11C 27/026 330/9 |
| 8,547,446 | B2* | 10/2013 | Itano | H03F 3/45188 348/222.1 |
| 8,604,877 | B2* | 12/2013 | Chang | H03F 3/45475 330/253 |
| 9,362,873 | B2* | 6/2016 | Harada | H03F 3/45197 |
| 9,729,114 | B2* | 8/2017 | Astgimath | H03F 3/187 |
| 10,236,843 | B2 | 3/2019 | Wadekar et al. | |
| 2011/0096186 | A1 | 4/2011 | Itano | |
| 2020/0083852 | A1 | 3/2020 | Guidry | |

OTHER PUBLICATIONS

Ramirez-Angulo J. et al. "The Flipped Voltage Follower: A useful cell for low-voltage low-power circuit design." © 2002 IEEE. pp. III-615 thru III-618.

(Continued)

*Primary Examiner* — Khanh V Nguyen

(57) ABSTRACT

An amplifier including a P-channel transistor having current terminals coupled between a first node and a second node and having a control terminal coupled to a third node receiving an input voltage, an N-channel transistor having current terminals coupled between a fourth node developing an output voltage and a supply voltage reference and having a control terminal coupled to the second node, a first resistor coupled between the first node and a supply voltage, a second resistor coupled between the first and fourth nodes, and a current sink sinking current from the second node to the supply reference node. The amplifier may be converted to differential form for amplifying a differential input voltage. Current devices may be adjusted for common mode, and may be moved or added to improve headroom or to improve power supply rejection. Chopper circuits may be added to reduce 1/f noise.

19 Claims, 6 Drawing Sheets

(56) References Cited

OTHER PUBLICATIONS

Rijns, J.J.F. "CMOS Low-Distortion High-Frequency Variable-Gain Amplifier." IEEE Journal of Solid-State Circuits, vol. 31, No. 7, Jul. 1996. pp. 1029-1034.
Acosta, Lucía et al. "Highly Linear Tunable CMOS Gm-C Low-Pass Filter." IEEE Transactions on Circuits and Systems-I: Regular Papers, vol. 56, No. 10, Oct. 2009. pp. 2145-2158.

\* cited by examiner

AMPLIFIER WITH LOW COMPONENT COUNT AND ACCURATE GAIN

BACKGROUND

Field of the Invention

The present invention relates in general to amplifiers, and more particularly to a low component count amplifier with a minimal number of transistors and with accurate gain.

Description of the Related Art

Conventional amplifiers with accurate gain are usually complex in that they contain a high number of transistors or transconductance devices. Such complexity often increases cost, circuit area, and design time.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A simple amplifier with accurate gain that uses a minimal number of transistors is disclosed herein. A single-ended form is shown along with several differential forms. An additional current sink may be added to serve as a tail current source to improve supply rejection. Current sources may be split or additional current sources added to improve headroom. Various embodiments are shown including chopper circuits to remove 1/f noise.

Figure 1:
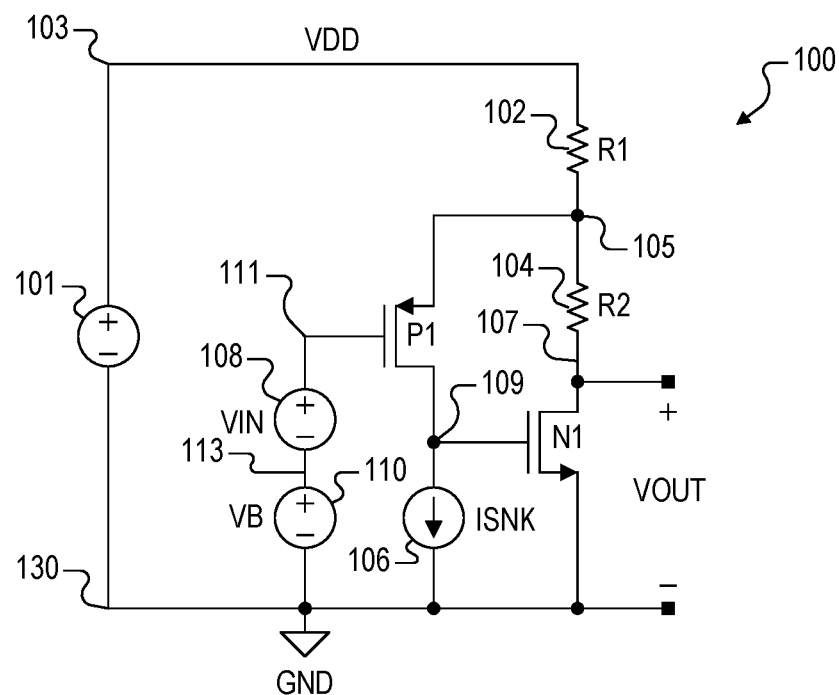
FIG. 1 is a schematic diagram of an amplifier implemented according to a first embodiment of the present disclosure with a single-ended form.

FIG. 1 is a schematic diagram of an amplifier 100 implemented according to a first embodiment of the present disclosure, in which the amplifier 100 has a single-ended form. A voltage supply 101 generates a supply voltage VDD on a supply voltage node 103 relative to a supply reference voltage, such as ground (GND) on a supply reference node 130. A first resistor 102 with resistance R1 is coupled between VDD and a node 105, and a second resistor 104 with resistance R2 is coupled between node 105 and an output node 107 generating an output voltage VOUT. An N-channel MOS (NMOS) transistor N1 has a drain terminal coupled to node 107, a gate terminal coupled to another node 109, and a source terminal coupled to GND. A P-channel MOS (PMOS) transistor P1 has a source terminal coupled to node 105, a gate terminal coupled to an input node 111, and a drain terminal coupled to node 109. A current sink 106 coupled between node 109 and GND sinks a current ISNK from node 109 to GND. An input voltage source 108 developing an input voltage VIN has a positive terminal coupled to the input node 111 and a negative terminal coupled to a node 113. A direct-current (DC) voltage source 110 developing a bias voltage VB has a positive terminal coupled to node 113 and a negative terminal coupled to GND. Thus, node 113 develops the bias voltage VB and the input node 111 develops the voltage VIN+VB.

The transfer function A of the amplifier 100 is provided according to the following equation (1):

$$A = \frac{gm1 * gm2 * r01 * r02 * (R1 + R2)}{R1 + R2 + r02 + gm2 * R1 * r02 + gm1 * gm2 * R1 * r01 * r02} \quad (1)$$

where gm1 is the transconductance and r01 is a resistance of P1 and gm2 is the transconductance and r02 is a resistance of N1. If r0x>>R1 and R2 and gmx*r0x>>1, where "x" denotes 1 or 2 with reference to P1 or N1, then the transfer function A can be simplified to the following equation (2):

$$A = 1 + \frac{R2}{R1} \quad (2)$$

The amplifier 100 has a single-ended form for receiving a single-ended input voltage VIN. Biasing is dependent upon VB, the common-mode of VOUT is related to the common mode of VIN, and the range of VIN is somewhat limited. Nonetheless, depending upon the application of the amplifier 100, it is very simple and can have very accurate gain.

Figure 2:
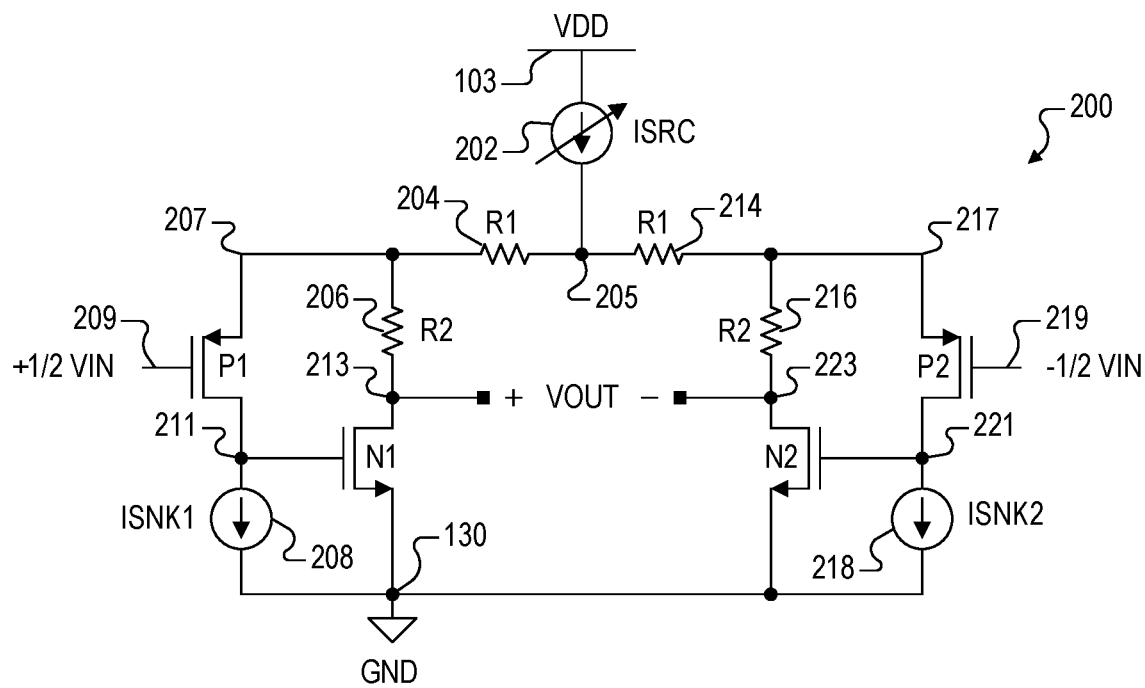
FIG. 2 is a schematic diagram of an amplifier implemented according to a second embodiment of the present disclosure with a differential form.

FIG. 2 is a schematic diagram of an amplifier 200 implemented according to a second embodiment of the present disclosure, in which the amplifier 200 has a differential form. A current source 202 coupled between VDD and a node 205 sources a current ISRC from node VDD to the node 205. The current source 202 is shown as adjustable in which ISRC may be adjusted based on sensing a common mode voltage as further described herein. A first resistor 204 having a resistance R1 is coupled between node 205 and a node 207, and a second resistor 206 having a resistance R2 is coupled between node 207 and a first output node 213 that develops a positive polarity of an output voltage VOUT. A first NMOS transistor N1 has a drain terminal coupled to node 213, a gate terminal coupled to another node 211, and a source terminal coupled to GND. A first PMOS transistor P1 has a source terminal coupled to node 207, a gate terminal coupled to a positive polarity input node 209 receiving a positive polarity input voltage +½VIN, and a drain terminal coupled to the node 211. A first current sink 208 coupled between node 211 and GND sinks a current ISNK1 from node 211 to GND. It is noted that the resistances R1 and R2 of the amplifier 200 are not necessarily the same as the resistances R1 and R2 of the amplifier 100.

A negative polarity half of the amplifier 200 is substantially similar to the positive polarity half. A third resistor 214 having a resistance R1 is coupled between node 205 and a node 217, and a fourth resistor 216 having a resistance R2 is coupled between node 217 and a second output node 223 that develops a negative polarity of VOUT. Thus, VOUT is a differential output voltage developed between nodes 213 and 223. A second NMOS transistor N2 has a drain terminal coupled to node 223, a gate terminal coupled to another node 221, and a source terminal coupled to GND. A second PMOS transistor P2 has a source terminal coupled to node 217, a gate terminal coupled to a negative polarity input node 219 receiving a negative polarity input voltage −½VIN, and a drain terminal coupled to the node 221. Thus, a differential input voltage ±VIN is provided between the inputs nodes 209 and 219. A second current sink 218 coupled between node 221 and GND sinks a current ISNK2 from node 221 to GND.

The transfer function of the amplifier 200 is the same as the amplifier 100 as defined by equation (1) above, and may be simplified in the same manner to that defined by equation (2) above. Although the transfer function is the same, the DC biasing of the amplifier 200 is not dependent upon the input common-mode. In addition, instead of connecting the NMOS transistor source terminals to ground, the two NMOS source terminals can be connected to a non-zero voltage source, which gives more freedom in DC biasing. Also, a resistor can be connected from the two source terminals to ground, which can give better power supply rejection. In all cases, the AC transfer function remains the same.

Figure 3:
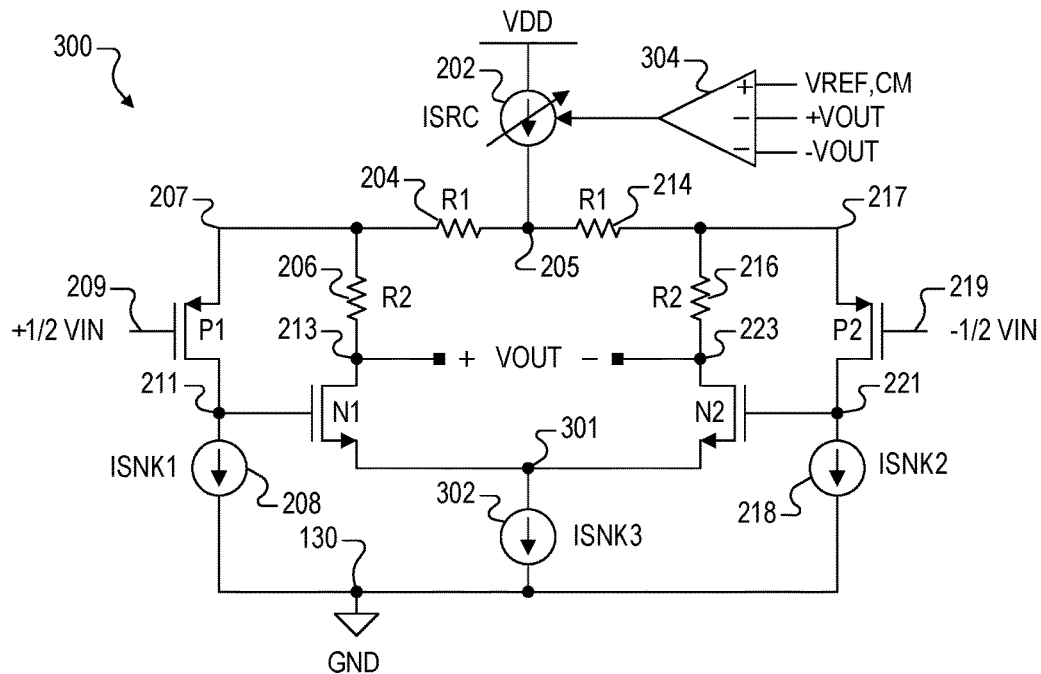
FIG. 3 is a schematic diagram of an amplifier implemented according to a third embodiment of the present disclosure including common mode control of the upper current source and an additional current sink.

FIG. 3 is a schematic diagram of an amplifier 300 implemented according to a third embodiment of the present disclosure, in which the amplifier 300 has a differential form similar to that of the amplifier 200. The amplifier 300 includes similar components as the amplifier 200 having the identical reference numerals. A primary difference of amplifier 300 is that the source terminals of N1 and N2 are not coupled to GND but instead are coupled together at a common node 301, and a third current sink 302 is added and coupled between node 301 and GND which sinks a current ISNK3 from node 301 to GND. The current sink 302 serves as a tail current source that is added to improve supply rejection even further. The AC transfer function of the amplifier 300 is the same as the amplifier 200 as defined by equations (1) and (2) previously described.

In addition, a common-mode (CM) sense amplifier 304 is added to set the output common-mode, in which the amplifier 304 has an output used to control the current source 202, which is shown as an adjustable current source having an adjust input coupled to the output of the CM sense amplifier 304. In the illustrated configuration, the output CM voltage of the differential output voltage ±VOUT is compared to a CM set voltage (VREF,CM), and fed back to control the current source 202. Although not specifically shown, the CM feedback can also be done by adjusting current through the two current sources 208 and 218 based on a common mode voltage, or by adjusting current through the current sink 302. Alternatively, instead of using ±VOUT to sense CM, the CM may be sensed at node 205 or at the voltage of node 301.

Figure 4:
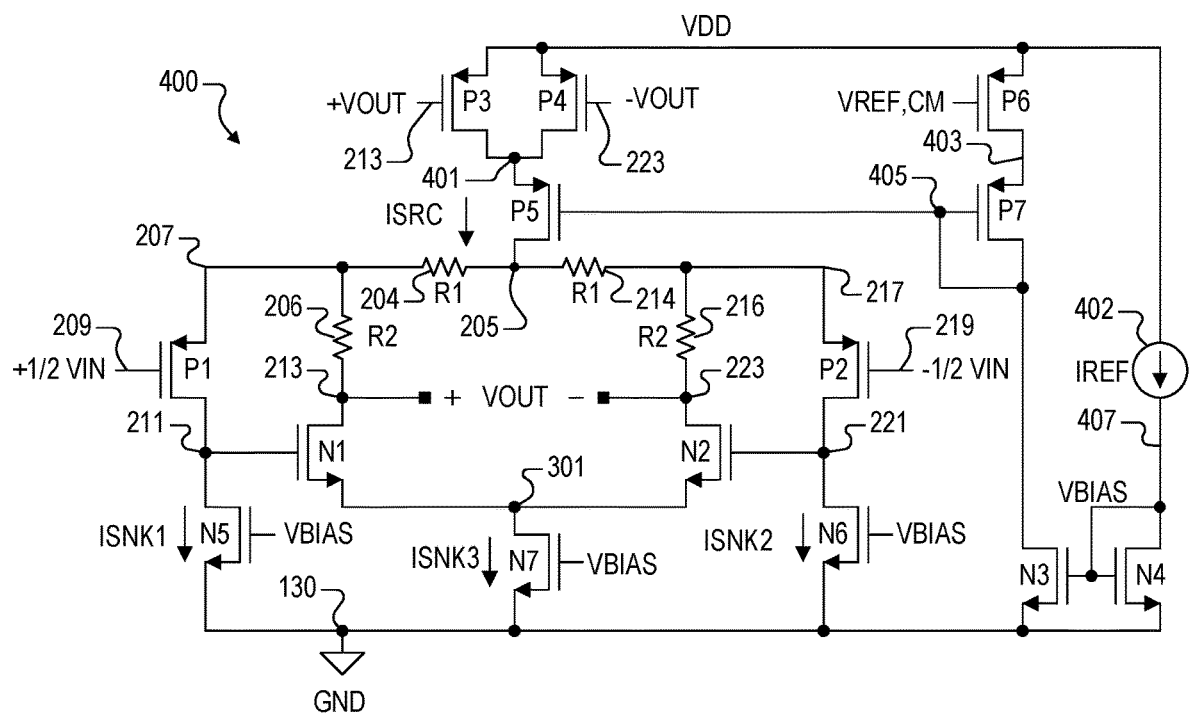
FIG. 4 is a schematic diagram of an amplifier implemented according to a fourth embodiment of the present disclosure illustrating a particular common mode configuration.

FIG. 4 is a schematic diagram of an amplifier 400 implemented according to a fourth embodiment of the present disclosure, in which the amplifier 400 has a differential form similar to that of the amplifier 300. The amplifier 400 includes similar components as the amplifier 300 having the identical reference numerals. In addition, the resistors 204, 214, 206, and 216, and the transistors N1, N2, P1, and P2 are coupled to the nodes 205, 207, 211, 213, 217, 221, 223, and 301 for receiving ±VIN and for providing ±VOUT in a similar manner. For the amplifier 400, the current source 202 and the CM sense amplifier 304 are replaced by PMOS transistors P3, P4, P5, P6 and P7, NMOS transistors N3 and N4, and a current source 402. The current sinks 208, 218, and 302 are replaced by NMOS transistors N5, N6 and N7, respectively.

P3 and P4 have source terminals coupled to VDD and drain terminals coupled together at an intermediate node 401. P3 has a gate terminal coupled to the positive output node 213 and P4 has a gate terminal coupled to the negative output 223. P5 has a source terminal coupled to node 401, a drain terminal coupled to node 205, and a gate terminal coupled to a node 405. P6 has a source terminal coupled to VDD, a gate terminal receiving the CM set voltage VREF, CM, and a drain terminal coupled to a node 403. P7 has a source terminal coupled to node 403 and has gate and drain terminals coupled together at node 405. The current source 402 is referenced to VDD and sources a reference current IREF into a node 407. N3 has a drain terminal coupled to node 405, a gate terminal coupled to node 407 developing a bias voltage VBIAS, and a source terminal coupled to GND. N4 has gate and drain terminals coupled together at node 407 and a source terminal coupled to GND. N5, N6 and N7 each have a source terminal coupled to GND and a gate terminal receiving VBIAS. N5 has a drain terminal coupled to node 211 for developing the sink current ISKN1, N6 has a drain terminal coupled to node 221 for developing the sink current ISKN2, and N7 has a drain terminal coupled to node 301 for developing the sink current ISKN3.

VREF,CM is set to a desired CM voltage and provided to the gate terminal of P6, which is biased in its linear region. The current through diode-connected P7 is mirrored through P5 to the node 205 of the amplifier 400. The CM is set through P3 and P4 at the output of the amplifier. IREF flows through the diode-connected N4 to establish VBIAS at the gate terminals of N3 and N4, which biases the N5, N6 and N7 to establish the sink currents ISNK1, ISNK2, and ISNK3, respectively. Many alternative CM arrangements are also known and available.

It is noted that the common mode schemes shown for the amplifiers 300 and 400 may be applied to any of the amplifiers shown and described herein.

Figure 5:
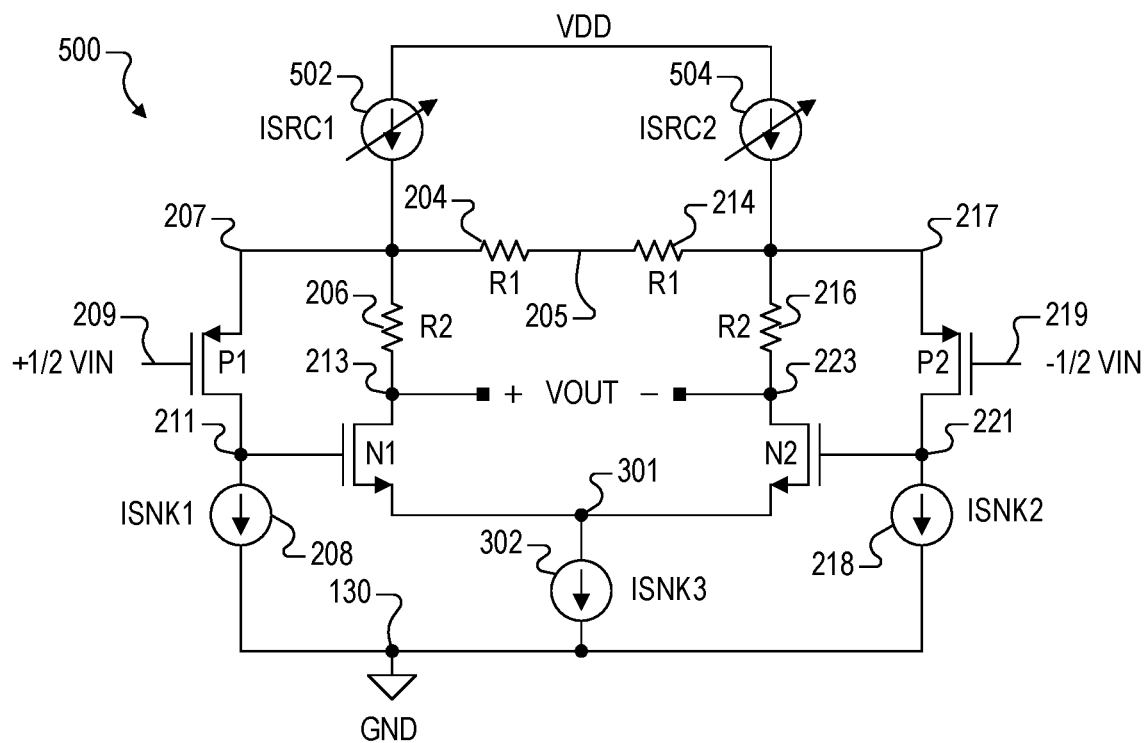
FIG. 5 is a schematic diagram of an amplifier implemented according to a fifth embodiment of the present disclosure with improved headroom.

FIG. 5 is a schematic diagram of an amplifier 500 implemented according to a fifth embodiment of the present disclosure with improved headroom, in which the amplifier 500 is substantially similar to the amplifier 300. As shown, the amplifier 500 includes the same components and nodes as the amplifier 300, except that the upper adjustable current source 202 providing the source current ISRC of the amplifier 300 is replaced by two adjustable current sources 502 and 504. The current sources 502 and 504 may be adjusted based on sensing the common mode voltage as described herein. Alternatively, the current sinks 208 and 218 or the current sink 302 may be adjusted based on sensing the common mode voltage. The current source 502 has a negative terminal coupled to VDD and a positive terminal coupled to node 207 for sourcing a current ISRC1 into the node 207, and current source 504 has a negative terminal coupled to VDD and a positive terminal coupled to node 217 for sourcing a current ISRC2 into the node 217. The use of two upper current sources on either side of the resistors 204 (R1) and 214 (R2) rather than a single current source coupled to node 205 avoids the voltage drop across R1 and R2, thus providing more voltage headroom for the pair of current sources 502 and 504. The splitting of the upper current source into two current sources may also be applied to the amplifiers 200 and 400.

Figure 6:
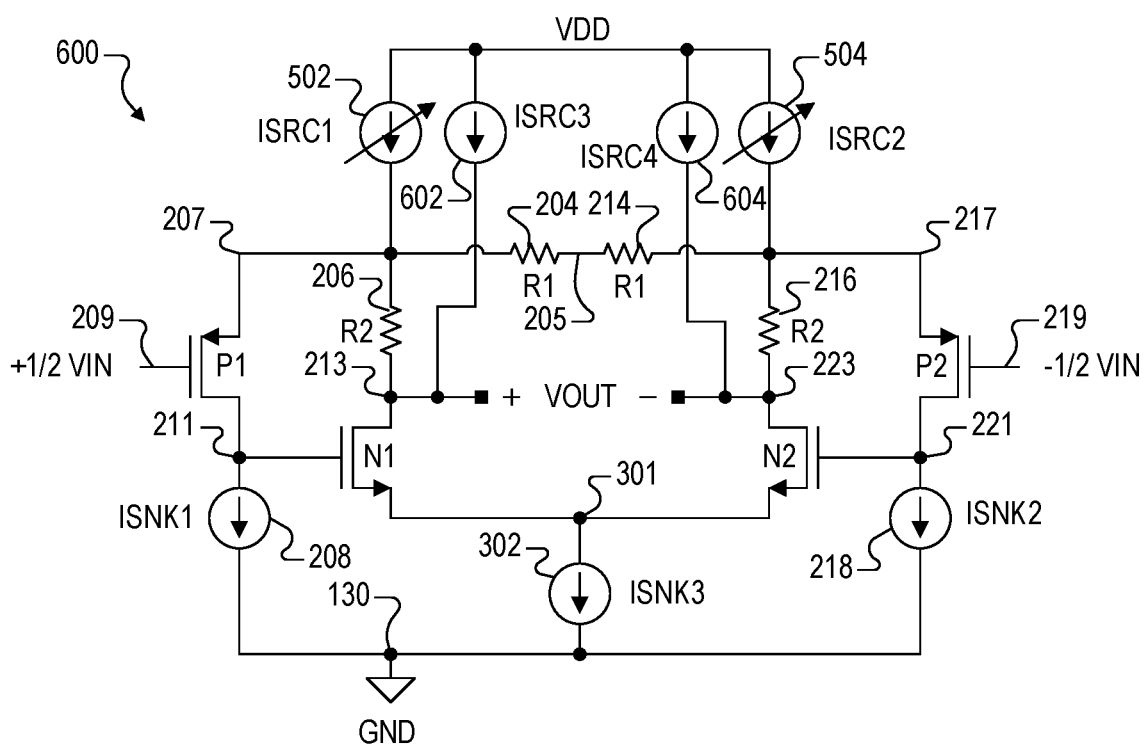
FIG. 6 is a schematic diagram of an amplifier implemented according to a sixth embodiment of the present disclosure with further improved headroom.

FIG. 6 is a schematic diagram of an amplifier 600 implemented according to a sixth embodiment of the present disclosure with further improved headroom, in which the amplifier 600 is substantially similar to the amplifier 500. As shown, the amplifier 600 includes the same components and nodes as the amplifier 500, and further includes two additional current sources 602 and 604. The current source 602 has a negative terminal coupled to VDD and a positive terminal coupled to node 213 for sourcing a current ISRC3 into the node 213, and current source 604 has a negative terminal coupled to VDD and a positive terminal coupled to node 223 for sourcing a current ISRC4 into the node 223. Two additional current sources 602 and 604 are added to provide the bias current to the two NMOS transistors N1 and N2, respectively. This avoids the NMOS bias current to run through the R2 resistances 206 and 216, avoiding voltage drop across R2, and avoiding headroom problems for N1 and N2 at low supply voltages. The addition of the two current sources for additional headroom may also be applied to amplifiers 200, 300, and 400.

Figure 7:
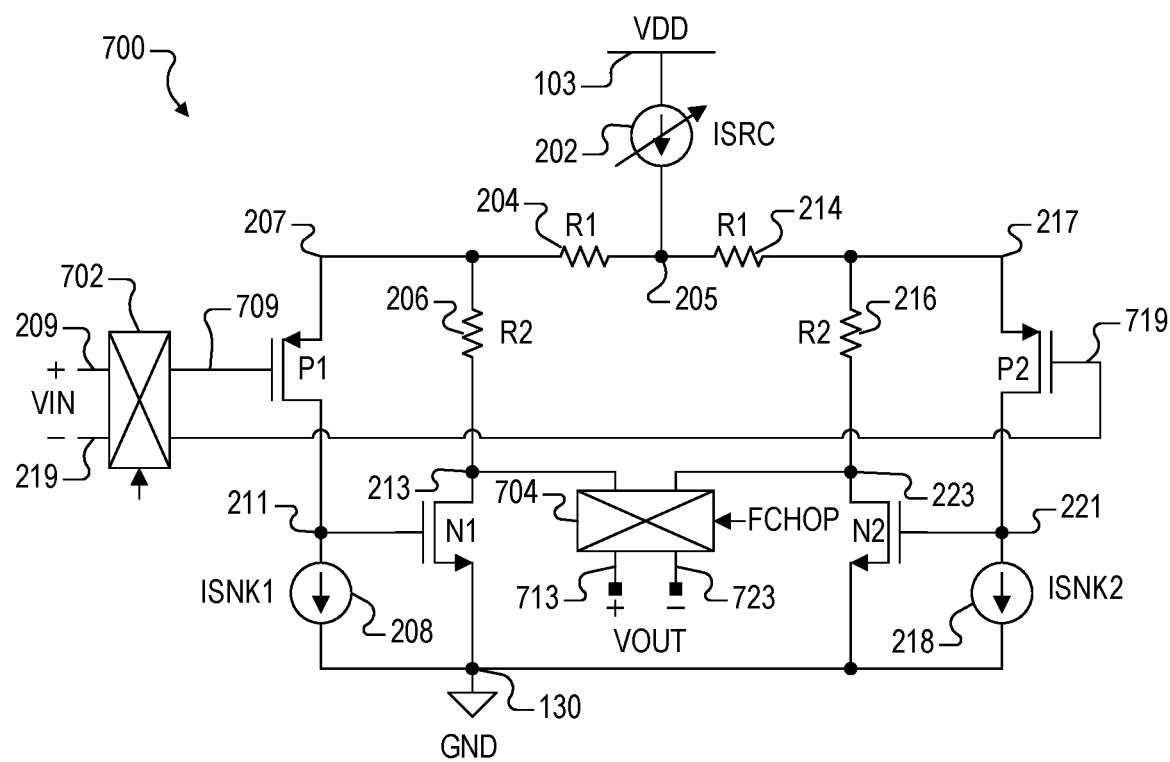
FIG. 7 is a schematic diagram of an amplifier implemented according to a seventh embodiment of the present disclosure including choppers for removing offset or 1/f noise.

FIG. 7 is a schematic diagram of an amplifier 700 implemented according to a seventh embodiment of the present disclosure including choppers for removing offset or 1/f noise. The amplifier 700 is substantially similar to the amplifier 200 in which similar components coupled in substantially the same manner are included with identical reference numerals. The amplifier 700 includes a first chopper circuit 702 coupled at the input receiving ±VIN and a second chopper circuit 704 coupled at the output for providing ±VOUT. In particular, the first chopper circuit 702 has a pair of input terminals coupled to the input nodes 209 and 219, and has a pair of output terminals coupled to nodes 709 and 719 which are coupled to the gate terminals of P1 and P2, respectively. Similarly, the second chopper circuit 704 has a pair of input terminals coupled to the nodes 213 and 223 and has a pair of output terminals providing the differential output voltage ±VOUT at another pair of output nodes 713 and 723. Each of the chopper circuits 702 and 704 receives a chop clock FCHOP and crosses its inputs with its outputs at the rate of a frequency of FCHOP.

Although the chopping circuitry is shown applied to the configuration of the amplifier 200, it is equally applicable to the other amplifiers 300, 400, 500, and 600. Thus, for example, an additional current sink may be interposed between the source terminals of N1 and N2 as shown by the amplifier 300, or the adjustable current source 202 may be split into two current sources as shown by the amplifier 500, or additional current sources may be added to provide current to the output nodes 213 and 223 as shown by the amplifier 600, or any combination of these techniques.

A possible disadvantage of amplifier 700 is that the chopped signal is forced to pass through the high ohmic node at the gate terminals of N1 and N2. If the bandwidth is limited and the chopping frequency is high, the chopping process may not be as accurate as desired for a given application.

Figure 8:
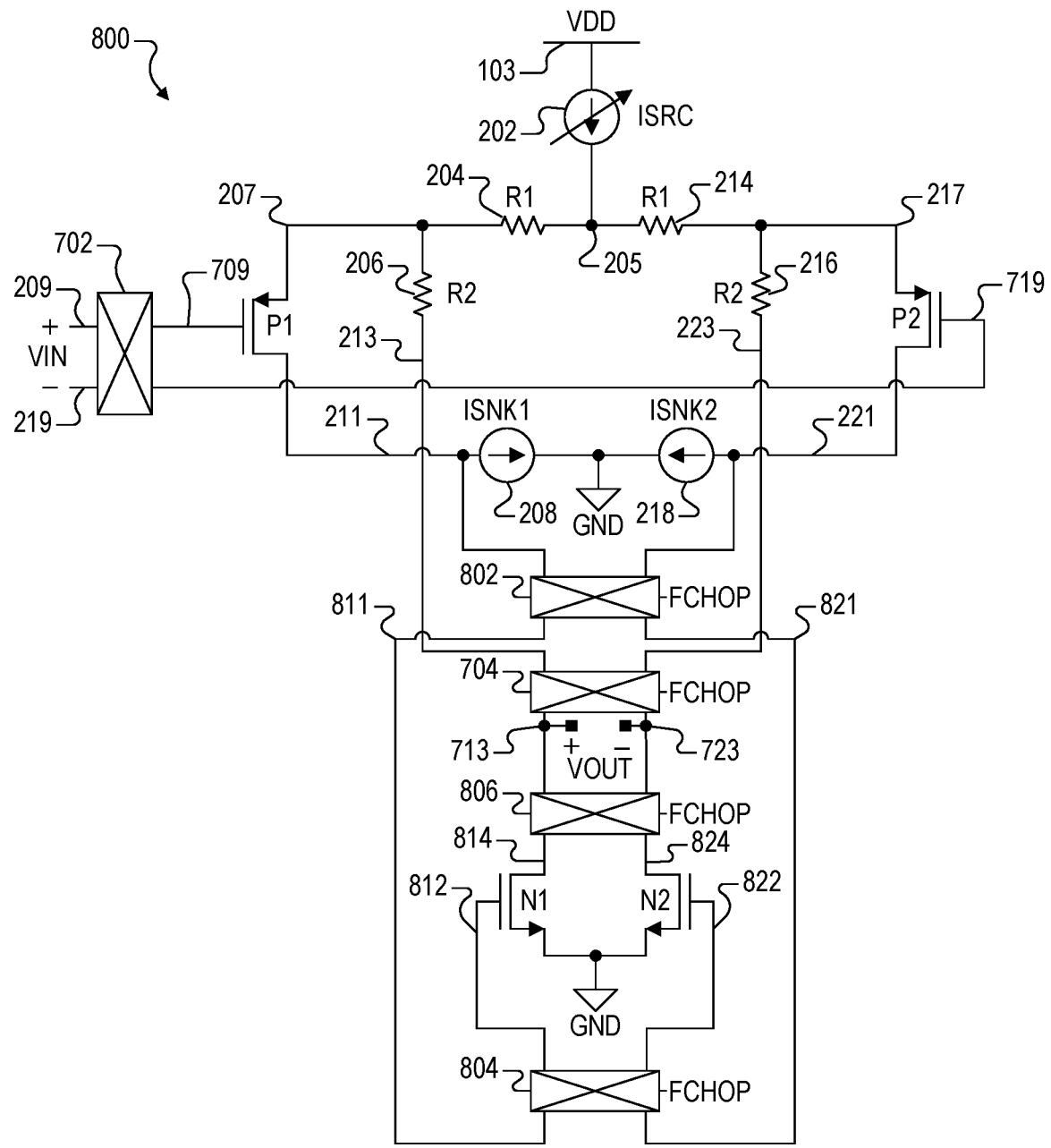
FIG. 8 is a schematic diagram of an amplifier implemented according to an eighth embodiment of the present disclosure also including choppers for removing offset or 1/f noise.

FIG. 8 is a schematic diagram of an amplifier 800 implemented according to an eighth embodiment of the present disclosure including choppers for removing offset or 1/f noise. The amplifier 800 is substantially similar to the amplifier 700 in which similar components coupled in substantially the same manner are included with identical reference numerals and includes the chopper circuits 702 and 704 coupled to operate in a similar manner. The amplifier 800, however, includes additional chopper circuits 802, 804, and 806, each receiving FCHOP and each operating to switch input and output terminals at the rate of FCHOP. The chopper circuit 802 has input terminals coupled to nodes 211 and 221 and has output terminals coupled to nodes 811 and 821. The chopper circuit 804 has input terminals coupled to nodes 811 and 821 and has output terminals coupled to nodes 812 and 822, in which the nodes 812 and 822 are instead coupled to the gate terminals of N1 and N2, respectively. The chopper circuit 806 has input terminals coupled to nodes 713 and 723 and has output terminals coupled to nodes 814 and 824, in which the nodes 814 and 824 are instead coupled to the drain terminals of N1 and N2, respectively.

The chopper circuits are now placed such that at the high ohmic nodes, the signal is at low frequencies (chopped back and forth), to avoid the chopped signal having to pass the high ohmic node, avoiding bandwidth limitations. In some cases, the chopper circuits 804 and 806 may be omitted if the 1/f noise of N1 and N2 is rejected by the first stage formed by the PMOS transistors P1 and P2 and their current sources 208 and 218.

A possible disadvantage of the amplifier 800 is that the gain is now partly defined by the chopper switches. The switches of the chopper circuit 704 between the resistors 206 and 216 and the output voltage VOUT are in series and therefore the switch resistance of the chopper circuit 704 should be low compared to the resistance R2. For example, if R2 is 100 kilo-ohms (kΩ), and the chopper switch is 1 kΩ, this leads to a gain error of about 1%, which is very acceptable in many applications if not all applications.

Although the chopping circuitry is shown applied to the configuration of the amplifier 200, it is equally applicable to the other amplifiers 300, 400, 500, and 600. Thus, for example, an additional current sink may be interposed between the source terminals of N1 and N2 as shown by the amplifier 300, or the adjustable current source 202 may be split into two current sources as shown by the amplifier 500, or additional current sources may be added to provide current to the output nodes 213 and 223 as shown by the amplifier 600, or any combination of these techniques.

Figure 9:
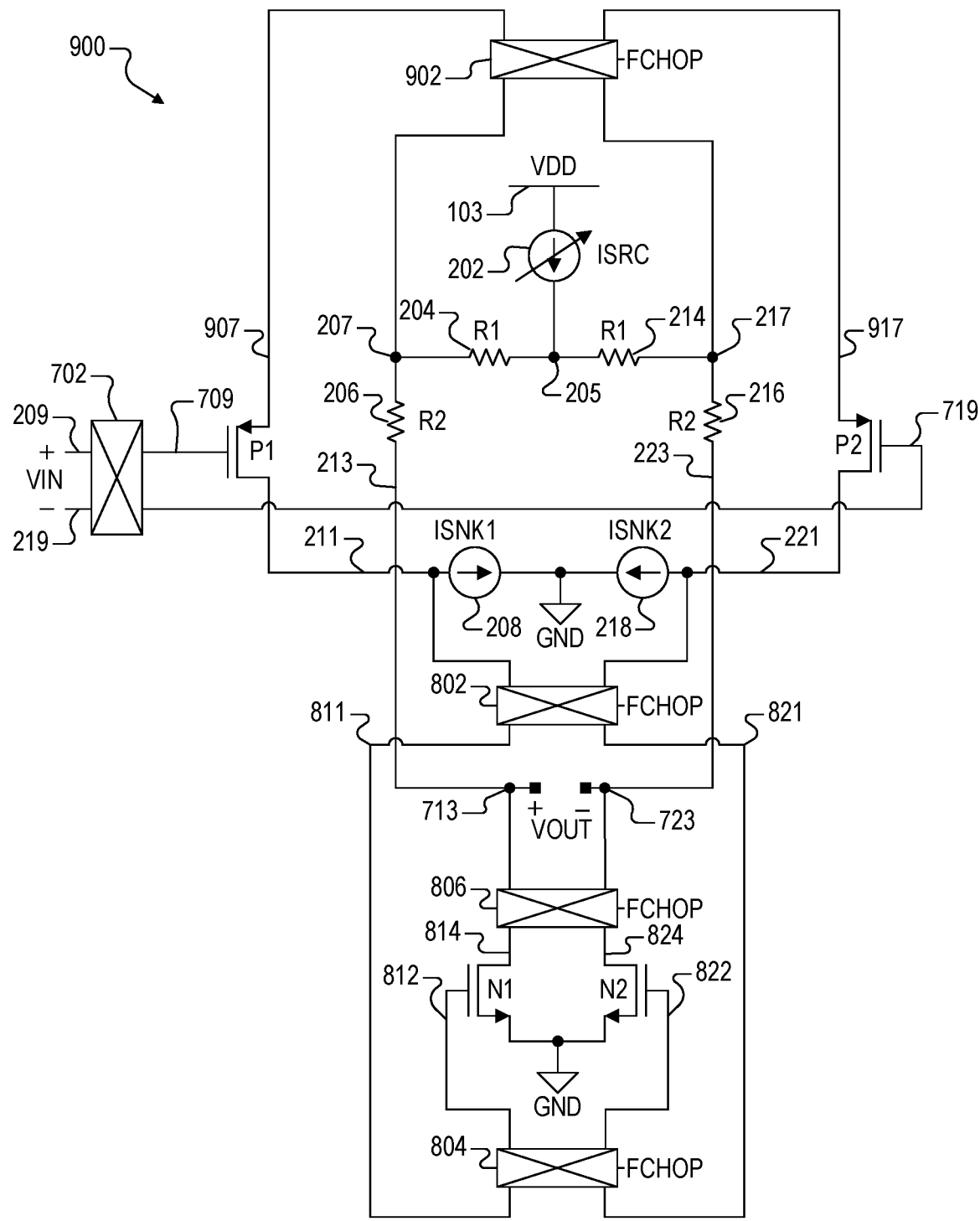
FIG. 9 is a schematic diagram of an amplifier implemented according to a ninth embodiment of the present disclosure also including choppers for removing offset or 1/f noise

FIG. 9 is a schematic diagram of an amplifier 900 implemented according to a ninth embodiment of the present disclosure including choppers for removing offset or 1/f noise. The amplifier 900 is substantially similar to the amplifier 800 in which similar components coupled in substantially the same manner are included with identical reference numerals. In this case, the chopper circuits 702, 802, 804, and 806 are included and coupled in similar manner, but the chopper circuit 704 is omitted so that ±VOUT is between nodes 213 and 223. In addition, another chopper circuit 902 is added having input terminals coupled to nodes 207 and 217 and output terminals coupled to nodes 907 and 917 which are coupled to the source terminals of P1 and P2, respectively.

In this case, chopping is done before and directly after the PMOS transistors P1 and P2 to avoid the chopped signal having to pass the high ohmic node. In addition, in some cases, the chopper circuits 804 and 806 may be omitted if the 1/f noise of N1 and N2 is rejected by the first stage formed by the PMOS transistors P1 and P2 and their current sources 208 and 218. Compared to the amplifier 800, one of the chopper circuits is moved to the sources of the PMOS transistors P1 and P2 to reduce the effect of the choppers switch resistance in the gain accuracy.

Although the chopping circuitry is shown applied to the configuration of the amplifier 200, it is equally applicable to the other amplifiers 300, 400, 500, and 600. Thus, for example, an additional current sink may be interposed between the source terminals of N1 and N2 as shown by the amplifier 300, or the adjustable current source 202 may be split into two current sources as shown by the amplifier 500, or additional current sources may be added to provide current to the output nodes 213 and 223 as shown by the amplifier 600, or any combination of these techniques.

The transfer function A of the amplifier 900 is provided according to the following equation (3):

$$A = \frac{gm1*r01*r02*(R1+gm2*R1*r03+gm2*R2*r03)}{A+B+C+D+E+F+G+H+I+J+K+L} \quad (3)$$

where A=R1*R2, B=R1*r01, C=R1+r02, D=R2*r01, E=R1*r03, F=R2*r03, G=r01*ro2, H=r02*r03, I=gm1*R1*R2*r01, J=gm1*R1*r01*r02, K=gm2*R1*r02*r03, L=gm1*gm2*R1*r01*r02*r03, and where r03 is the output resistance of the current sources 208 and 218. If r03 goes to infinity (or is very high), then the transfer function of the amplifier 900 is the same as equation (1), and if r0$x$>>R1 and R2 and gmx*r0$x$>>1, where "x" denotes 1 or 2 with reference to P1 or N1, then the transfer function A can be simplified to equation (2). It is noted that when a resistance RSW of the chopper switches is not zero, then the denominator is changed to incorporate RSW. But even if so, RSW plays only a limited role in gain accuracy. In addition, if r03 goes to infinity (or is very high), then RSW disappears from the equation. Thus, gain accuracy may be improved by increasing r03.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An amplifier, comprising:
   a P-channel transistor having current terminals coupled between a first node and a second node and having a control terminal coupled to a third node for receiving an input voltage;
   an N-channel transistor having current terminals coupled between a fourth node and a supply voltage reference node and having a control terminal coupled to the second node;
   a first resistor having a first terminal coupled to the first node and having a second terminal coupled to a supply voltage node;
   a second resistor coupled between the first node and the fourth node, wherein the fourth node develops an output voltage; and
   a current sink coupled between the second node and the supply voltage reference node;
   a second current sink interposed between a current terminal of the N-channel transistor and the supply voltage reference node.

2. The amplifier of claim 1, further comprising a direct-current bias voltage source that adds a direct-current offset to the input voltage.

3. The amplifier of claim 1, further comprising a current source interposed between the supply voltage node and the second terminal of the first resistor.

4. The amplifier of claim 1, further comprising:
   a current source interposed between supply voltage node and the second terminal of the first resistor.

5. An amplifier, comprising:
   a positive polarity circuit, comprising:
      a first P-channel transistor having current terminals coupled between a first node and a second node and having a control terminal coupled to a third node for receiving a positive polarity of an input voltage;
      a first N-channel transistor having current terminals coupled between a fourth node and a supply voltage reference node and having a control terminal coupled to the second node;
      a first resistor coupled between the first node and a fifth node;
      a second resistor coupled between the first node and the fourth node, wherein the fourth node develops a positive polarity of an output voltage; and
      a first current sink coupled between the second node and the supply voltage reference node;
   a current source coupled to a supply voltage node and providing a source current to the fifth node; and
   a negative polarity circuit, comprising:
      a third resistor coupled between the fifth node and a sixth node;
      a second P-channel transistor having current terminals coupled between the sixth node and a seventh node and having a control terminal coupled to an eighth node for receiving a negative polarity of the input voltage;
      a fourth resistor coupled between the sixth node and a ninth node, wherein the ninth node develops a negative polarity of the output voltage;
      a second N-channel transistor having current terminals coupled between the ninth node and the supply voltage reference node and having a control terminal coupled to the seventh node; and a second current sink coupled between the seventh node and the supply voltage reference node;

wherein the current source is configured to adjust the source current based on a difference between a common-mode set voltage and a common mode voltage.

6. The amplifier of claim 5, wherein the first and third resistors have substantially the same resistance as each other, and wherein the second and fourth resistors have substantially the same resistance as each other.

7. An amplifier, comprising:
a positive polarity circuit, comprising:
a first P-channel transistor having current terminals coupled between a first node and a second node and having a control terminal coupled to a third node for receiving a positive polarity of an input voltage;
a first N-channel transistor having current terminals coupled between a fourth node and a supply voltage reference node and having a control terminal coupled to the second node;
a first resistor coupled between the first node and a fifth node;
a second resistor coupled between the first node and the fourth node, wherein the fourth node develops a positive polarity of an output voltage; and
a first current sink coupled between the second node and the supply voltage reference node;
a current source coupled to a supply voltage node and providing a source current to the fifth node; and
a negative polarity circuit, comprising:
a third resistor coupled between the fifth node and a sixth node;
a second P-channel transistor having current terminals coupled between the sixth node and a seventh node and having a control terminal coupled to an eighth node for receiving a negative polarity of the input voltage;
a fourth resistor coupled between the sixth node and a ninth node, wherein the ninth node develops a negative polarity of the output voltage;
a second N-channel transistor having current terminals coupled between the ninth node and the supply voltage reference node and having a control terminal coupled to the seventh node; and
a second current sink coupled between the seventh node and the supply voltage reference node;
wherein the first and second current sinks are configured to adjust first and second sink currents based on a difference between a common-mode set voltage and a common mode voltage.

8. An amplifier, comprising:
a positive polarity circuit, comprising:
a first P-channel transistor having current terminals coupled between a first node and a second node and having a control terminal coupled to a third node for receiving a positive polarity of an input voltage;
a first N-channel transistor having current terminals coupled between a fourth node and a supply voltage reference node and having a control terminal coupled to the second node;
a first resistor coupled between the first node and a fifth node;
a second resistor coupled between the first node and the fourth node, wherein the fourth node develops a positive polarity of an output voltage; and
a first current sink coupled between the second node and the supply voltage reference node;
a current source coupled to a supply voltage node and providing a source current to the fifth node; and
a negative polarity circuit, comprising:
a third resistor coupled between the fifth node and a sixth node;
a second P-channel transistor having current terminals coupled between the sixth node and a seventh node and having a control terminal coupled to an eighth node for receiving a negative polarity of the input voltage;
a fourth resistor coupled between the sixth node and a ninth node, wherein the ninth node develops a negative polarity of the output voltage;
a second N-channel transistor having current terminals coupled between the ninth node and the supply voltage reference node and having a control terminal coupled to the seventh node; and
a second current sink coupled between the seventh node and the supply voltage reference node;
a third current sink coupled between a tenth node and the supply voltage reference node, wherein the current terminals of the first N-channel transistor are coupled between the fourth node and the tenth node, and wherein the current terminals of the second N-channel transistor are coupled between the ninth node and the tenth node.

9. The amplifier of claim 8, wherein the current source is configured to adjust the source current based on a difference between a common-mode set voltage and a common mode voltage.

10. The amplifier of claim 8, further comprising a common mode voltage amplifier that is configured to control the current source to provide the source current based on a difference between a common-mode set voltage and a common mode voltage.

11. The amplifier of claim 10, wherein the common mode sense amplifier has inputs coupled to the positive and negative polarities of the output voltage for sensing the common mode voltage.

12. The amplifier of claim 8, wherein the third current sink is configured to adjust a sink current based on a difference between a common-mode set voltage and a common mode voltage.

13. The amplifier of claim 8, wherein:
each of the first, second, and third current sinks are configured as an N-channel transistor having a control terminal receiving a bias voltage;
wherein the current source comprises:
a third P-channel transistor having current terminals coupled between the supply voltage node and an eleventh node and having a control terminal coupled to the fourth node;
a fourth P-channel transistor having current terminals coupled between the supply voltage node and the eleventh node and having a control terminal coupled to the ninth node; and
a fifth P-channel transistor having current terminals coupled between the fifth and eleventh terminals and having a control terminal coupled to a twelfth node; and
further comprising:
a sixth P-channel transistor having current terminals coupled between the supply voltage node and a thirteenth node and having a control terminal receiving the common mode set voltage;

a seventh P-channel transistor having current terminals coupled between the twelfth and thirteenth nodes and having a control terminal coupled to the twelfth node;

a third N-channel transistor having current terminals coupled between the twelfth node and the supply voltage reference node and having a control terminal coupled to a fourteenth node for providing the bias voltage;

a common mode current source coupled between the supply voltage node and the fourteenth node that is configured to provide a common mode reference current to the fourteenth node; and a fourth N-channel transistor having current terminals coupled between the fourteenth node and the supply voltage reference node and having a control terminal coupled to the fourteenth node.

14. An amplifier, comprising:

a positive polarity circuit, comprising:
  a first P-channel transistor having current terminals coupled between a first node and a second node and having a control terminal coupled to a third node for receiving a positive polarity of an input voltage;
  a first N-channel transistor having current terminals coupled between a fourth node and a supply voltage reference node and having a control terminal coupled to the second node;
  a first resistor coupled between the first node and a fifth node;
  a second resistor coupled between the first node and the fourth node, wherein the fourth node develops a positive polarity of an output voltage; and
  a first current sink coupled between the second node and the supply voltage reference node;
a current source coupled to a supply voltage node and providing a source current to the fifth node; and
a negative polarity circuit, comprising:
  a third resistor coupled between the fifth node and a sixth node;
  a second P-channel transistor having current terminals coupled between the sixth node and a seventh node and having a control terminal coupled to an eighth node for receiving a negative polarity of the input voltage;
  a fourth resistor coupled between the sixth node and a ninth node, wherein the ninth node develops a negative polarity of the output voltage;
  a second N-channel transistor having current terminals coupled between the ninth node and the supply voltage reference node and having a control terminal coupled to the seventh node; and
  a second current sink coupled between the seventh node and the supply voltage reference node;
a first chopper circuit interposed between the positive and negative polarities of the input voltage and the control terminals of the first and second P-channel transistors and configured to chop at a chop frequency; and
a second chopper circuit interposed between the positive and negative polarities of the output voltage and the fourth and ninth nodes and configured to chop at the chop frequency.

15. An amplifier, comprising:

a positive polarity circuit, comprising:
  a first P-channel transistor having current terminals coupled between a first node and a second node and having a control terminal coupled to a third node for receiving a positive polarity of an input voltage;
  a first N-channel transistor having current terminals coupled between a fourth node and a supply voltage reference node and having a control terminal coupled to the second node;
  a first resistor coupled between the first node and a fifth node;
  a second resistor coupled between the first node and the fourth node, wherein the fourth node develops a positive polarity of an output voltage; and
  a first current sink coupled between the second node and the supply voltage reference node;
a current source coupled to a supply voltage node and providing a source current to the fifth node; and
a negative polarity circuit, comprising:
  a third resistor coupled between the fifth node and a sixth node;
  a second P-channel transistor having current terminals coupled between the sixth node and a seventh node and having a control terminal coupled to an eighth node for receiving a negative polarity of the input voltage;
  a fourth resistor coupled between the sixth node and a ninth node, wherein the ninth node develops a negative polarity of the output voltage;
  a second N-channel transistor having current terminals coupled between the ninth node and the supply voltage reference node and having a control terminal coupled to the seventh node; and
  a second current sink coupled between the seventh node and the supply voltage reference node;
a plurality of chopper circuits, each configured to chop at a chop frequency, including:
  a first chopper circuit interposed between the input voltage and the control terminals of the first and second P-channel transistors, the first chopper circuit having a pair of input terminals receiving the positive and negative polarities of the input voltage and a pair of output terminals coupled to the control terminals of the first and second P-channel transistors;
  second and third chopper circuits interposed between the second and seventh nodes and the control terminals of the first and second N-channel transistors, wherein the second chopper circuit has a pair of input terminals coupled to the second and seventh nodes and has a pair of output terminals, and wherein the third chopper circuit has a pair of input terminals coupled to the pair of output terminals of the second chopper circuit and has a pair of output terminals coupled to the control terminals of the first and second N-channel transistors;
  a fourth chopper circuit interposed between the second and fourth resistors and the output voltage, wherein the fourth chopper circuit has a pair of input terminals coupled to the second and fourth resistors and has a pair of output terminals coupled to the positive and negative polarities of the output voltage; and
  a fifth chopper circuit interposed between the first and second N-channel transistors and the output voltage, wherein the fifth chopper circuit has a pair of input terminals coupled to current terminals of the first and second N-channel transistors and has a pair of output terminals providing the positive and negative polarities of the output voltage.

16. An amplifier, comprising:

a positive polarity circuit, comprising:

a first P-channel transistor having current terminals coupled between a first node and a second node and having a control terminal coupled to a third node for receiving a positive polarity of an input voltage;

a first N-channel transistor having current terminals coupled between a fourth node and a supply voltage reference node and having a control terminal coupled to the second node;

a first resistor coupled between the first node and a fifth node;

a second resistor coupled between the first node and the fourth node, wherein the fourth node develops a positive polarity of an output voltage; and a first current sink coupled between the second node and the supply voltage reference node;

a current source coupled to a supply voltage node and providing a source current to the fifth node; and a negative polarity circuit, comprising:

a third resistor coupled between the fifth node and a sixth node;

a second P-channel transistor having current terminals coupled between the sixth node and a seventh node and having a control terminal coupled to an eighth node for receiving a negative polarity of the input voltage;

a fourth resistor coupled between the sixth node and a ninth node, wherein the ninth node develops a negative polarity of the output voltage;

a second N-channel transistor having current terminals coupled between the ninth node and the supply voltage reference node and having a control terminal coupled to the seventh node; and a second current sink coupled between the seventh node and the supply voltage reference node;

a plurality of chopper circuits, each configured to chop at a chop frequency, including:

a first chopper circuit interposed between the input voltage and the control terminals of the first and second P-channel transistors, the first chopper circuit having a pair of input terminals receiving the positive and negative polarities of the input voltage and a pair of output terminals coupled to the control terminals of the first and second P-channel transistors;

second and third chopper circuits interposed between the second and seventh nodes and the control terminals of the first and second N-channel transistors, wherein the second chopper circuit has a pair of input terminals coupled to the second and seventh nodes and has a pair of output terminals, and wherein the third chopper circuit has a pair of input terminals coupled to the pair of output terminals of the second chopper circuit and has a pair of output terminals coupled to the control terminals of the first and second N-channel transistors;

a fourth chopper circuit interposed between the first and second P-channel transistors and the first and sixth nodes, wherein the fourth chopper circuit has a pair of input terminals coupled to current terminals of the first and second P-channel transistors and has a pair of output terminals coupled to the first and sixth nodes; and a fifth chopper circuit interposed between the fourth and ninth nodes and the first and second N-channel transistors, wherein the fifth chopper circuit has a pair of input terminals coupled to the fourth and ninth nodes and has a pair of output terminals coupled to current terminals of the first and second N-channel transistors.

17. An amplifier, comprising:

a positive polarity circuit, comprising:

a first P-channel transistor having current terminals coupled between a first node and a second node and having a control terminal coupled to a third node for receiving a positive polarity of an input voltage;

a first N-channel transistor having current terminals coupled between a fourth node and a fifth node and having a control terminal coupled to the second node;

a first resistor having a first terminal coupled to the first node and having a second terminal coupled to a sixth node;

a second resistor coupled between the first node and the fourth node, wherein the fourth node develops a positive polarity of an output voltage; and a first current sink coupled between the second node and a supply voltage reference node;

a negative polarity circuit, comprising:

a second P-channel transistor having current terminals coupled between a seventh node and an eighth node and having a control terminal coupled to a ninth node for receiving a negative polarity of the input voltage;

a second N-channel transistor having current terminals coupled between a tenth node and the fifth node and having a control terminal coupled to the eighth node;

a third resistor coupled between the sixth and seventh nodes;

a fourth resistor coupled between the seventh and tenth nodes, wherein the tenth node develops a negative polarity of the output voltage; and a second current sink coupled between the eighth node and the supply voltage reference node;

a third current sink coupled between the fifth node and the supply voltage reference node;

a first current source coupled between a supply voltage node and the first node; and a second current source coupled between the supply voltage node and the seventh node.

18. The amplifier of claim 17, further comprising:

a first bias current source coupled between the supply voltage node and the fourth node; and a second bias current source coupled between the supply voltage node and the tenth node.

19. The amplifier of claim 17, wherein at least one of the first and second current sources, the first and second current sinks, and the third current sink is configured to be adjusted based on a sensed common mode voltage.

* * * * *